(12) United States Patent
Chen et al.

(10) Patent No.: US 8,587,856 B2
(45) Date of Patent: Nov. 19, 2013

(54) NONLINEAR AND GAIN OPTICAL DEVICES FORMED IN METAL GRATINGS

(75) Inventors: Gang Chen, Basking Ridge, NJ (US); Ronen Rapaport, Millburn, NJ (US)

(73) Assignee: Alcatel Lucent, Paris (FR)

( * ) Notice: Subject to any disclaimer, the term of this patent is extended or adjusted under 35 U.S.C. 154(b) by 1148 days.

(21) Appl. No.: 12/044,038

(22) Filed: Mar. 7, 2008

(65) Prior Publication Data

US 2009/0225401 A1    Sep. 10, 2009

(51) Int. Cl.
   *G02F 1/35*    (2006.01)
   *G02F 1/37*    (2006.01)
   *H01S 3/08*    (2006.01)

(52) U.S. Cl.
   USPC ............................. 359/245; 359/254; 359/346

(58) Field of Classification Search
   USPC .......................................... 359/245, 254, 346
   See application file for complete search history.

(56) References Cited

U.S. PATENT DOCUMENTS

| | | | |
|---|---|---|---|
| 5,073,725 A * | 12/1991 | Takano et al. | 359/328 |
| 6,169,624 B1 * | 1/2001 | Godil et al. | 359/237 |
| 6,982,819 B2 * | 1/2006 | Sawin et al. | 359/245 |
| 7,027,689 B2 | 4/2006 | Blumberg et al. | |
| 7,110,154 B2 * | 9/2006 | Ballato et al. | 359/245 |
| 7,206,114 B2 * | 4/2007 | Ballato et al. | 359/245 |
| 7,417,219 B2 * | 8/2008 | Catrysse et al. | 250/234 |
| 2002/0196509 A1 * | 12/2002 | Smilanski et al. | 359/188 |
| 2003/0042487 A1 * | 3/2003 | Sarychev et al. | 257/53 |
| 2005/0248830 A1 * | 11/2005 | Sawin et al. | 359/321 |

OTHER PUBLICATIONS

Berini et al., "Long-range surface plasmon-polariton waveguides and devices in lithium niobate", Journal of Applied Physics, vo. 101, 113114-1-11, published Jun. 15, 2007.*

Fan et al., "Second harmonic generation from patterned GaAs inside a subwavelength metallic hole array", Optics Express, vol. 14, issue 21, pp. 9570-9575 (published Oct. 16, 2006).* van Nieuwstadt et al. "Strong Modification of the Nonlinear Optical Response of Metallic Subwavelength Hole Arrays", Physical Review Letters, vol. 97, pp. 146102-1-4, (Oct. 6, 2006).*

* cited by examiner

*Primary Examiner* — Eric Bolda
(74) *Attorney, Agent, or Firm* — Hitt Gaines, PC

(57) ABSTRACT

A nonlinear optical system comprises a metallic film having a first side and a second side. The nonlinear optical system further comprises a regular array of slits in the metallic film. The slits connect the first and second sides of the metallic film. The array is configured to selectively transmit through the metallic film light having frequencies of a selected frequency band. The nonlinear optical system still further comprises a nonlinear optical material situated within the slit.

6 Claims, 15 Drawing Sheets

FRONT VIEW

FRONT VIEW

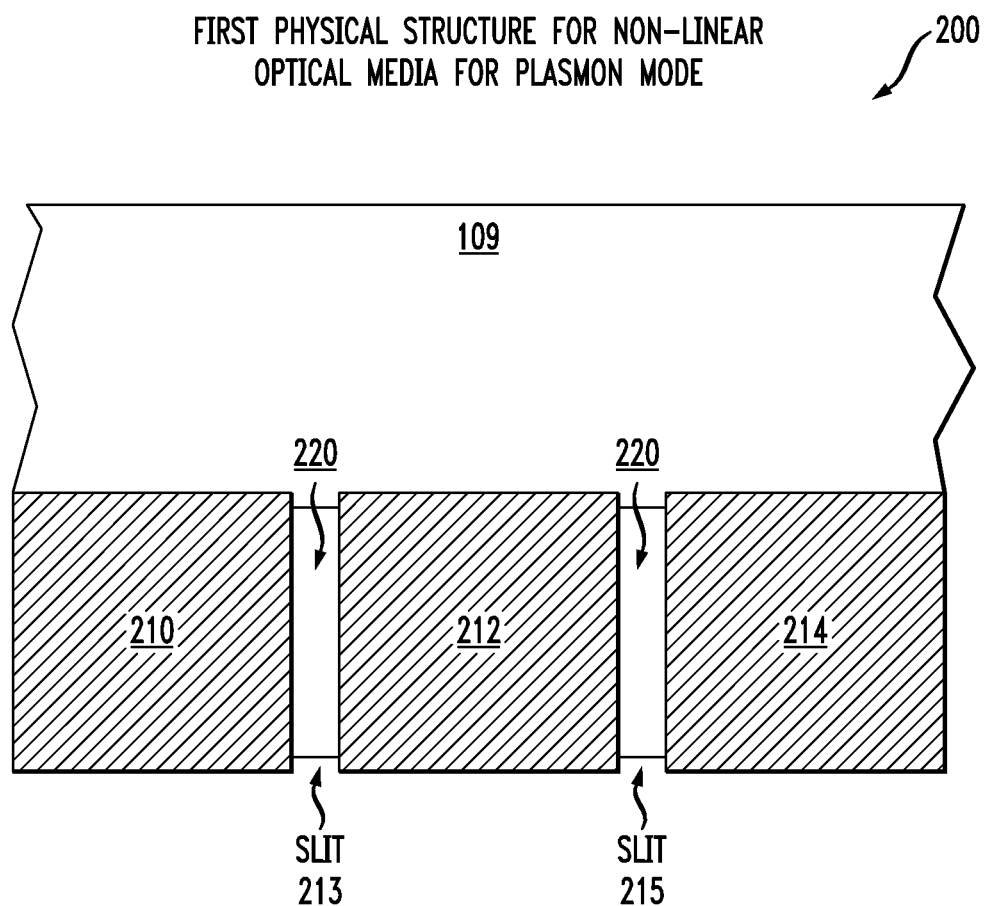

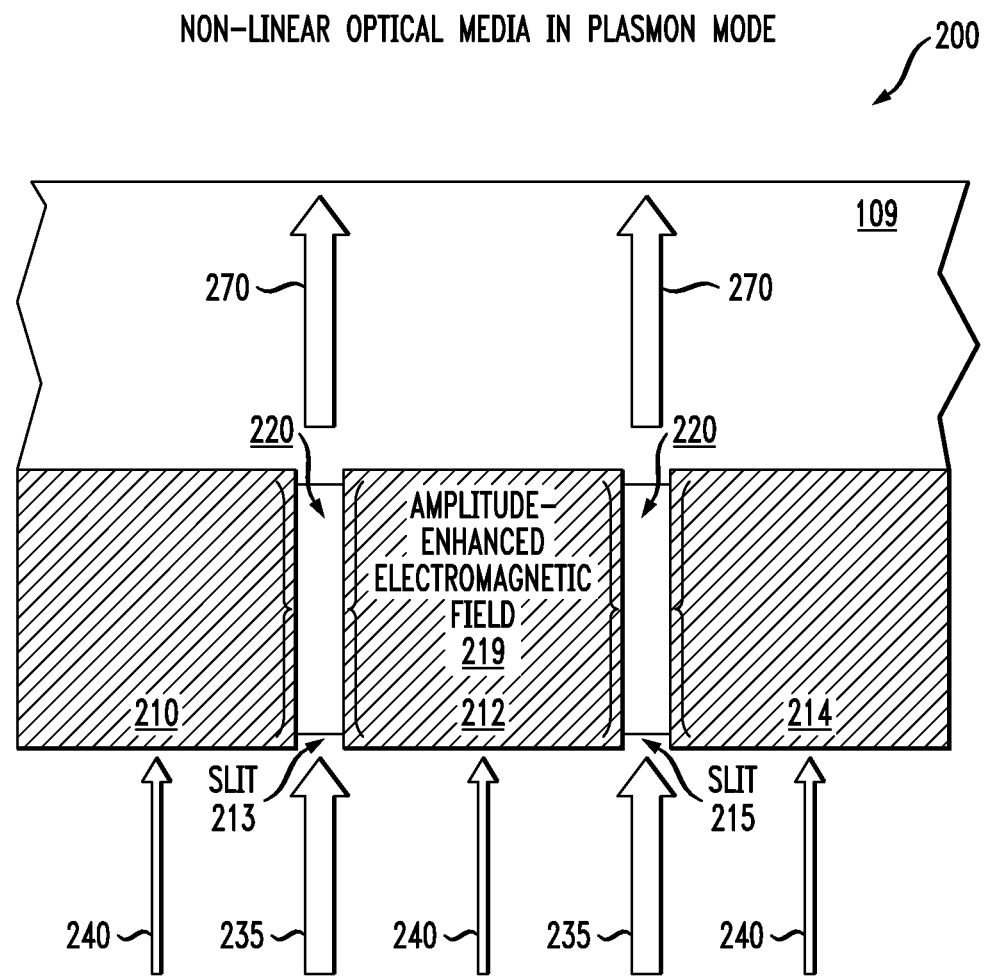

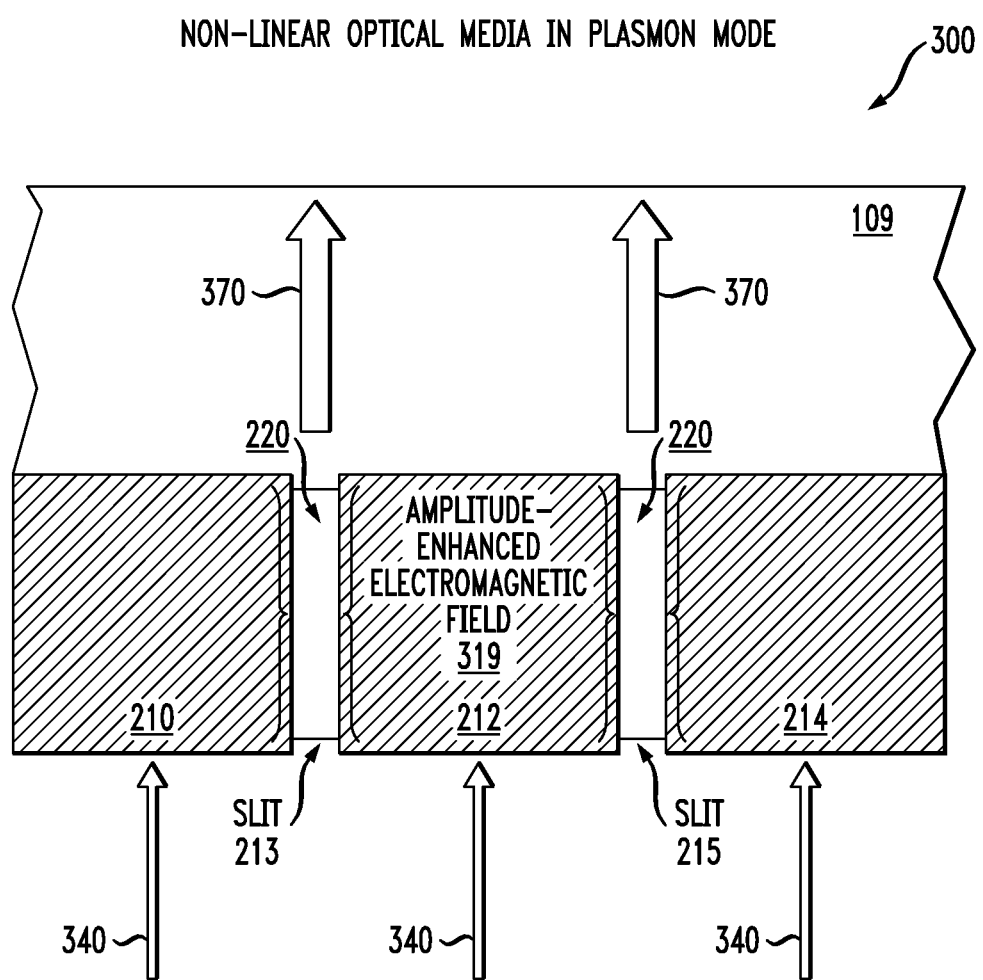

(CROSS-SECTIONAL VIEW THROUGH 101)
TOP VIEW

PHYSICAL STRUCTURE OF NON-LINEAR OPTICAL
MEDIA FOR WAVEGUIDE MODE

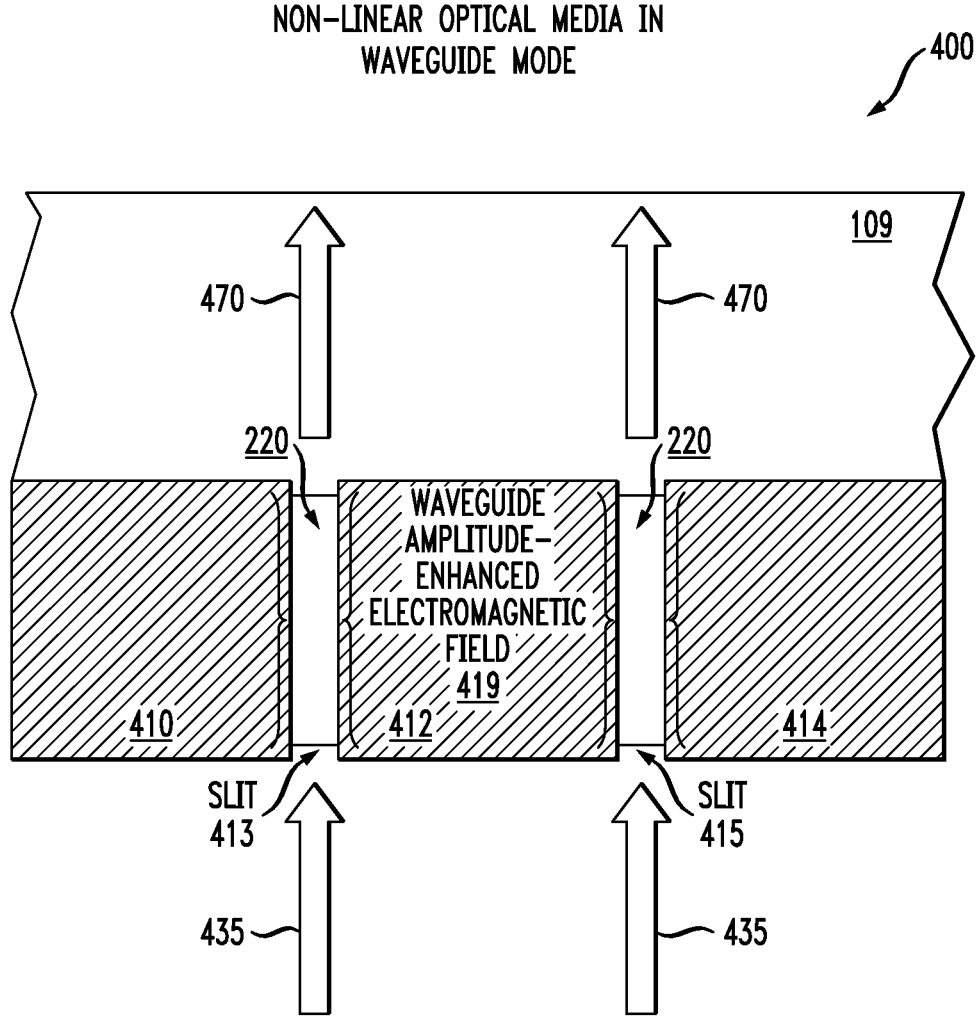

(CROSS-SECTIONAL VIEW THROUGH 101)
TOP VIEW

STRUCTURE FOR LASER MODE
(SUBSET OF WAVEGUIDE MODE)

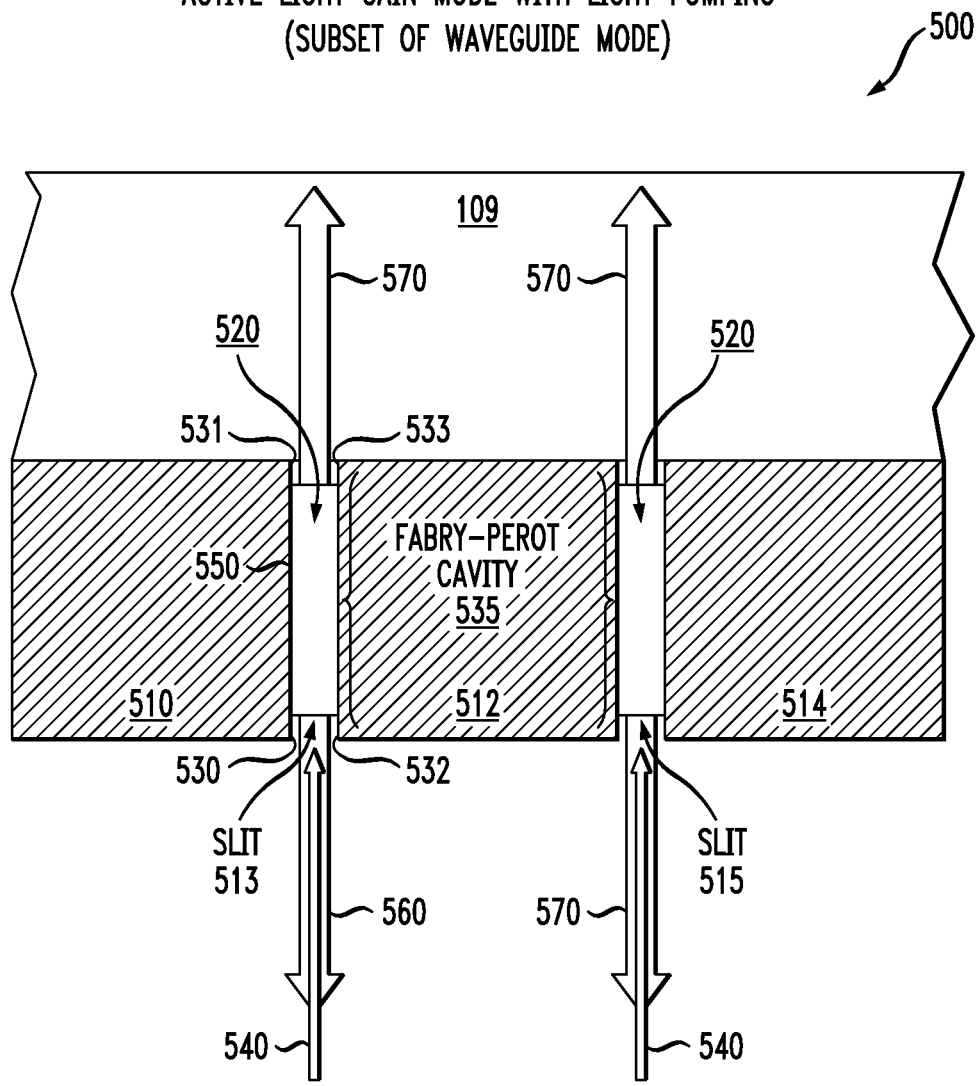

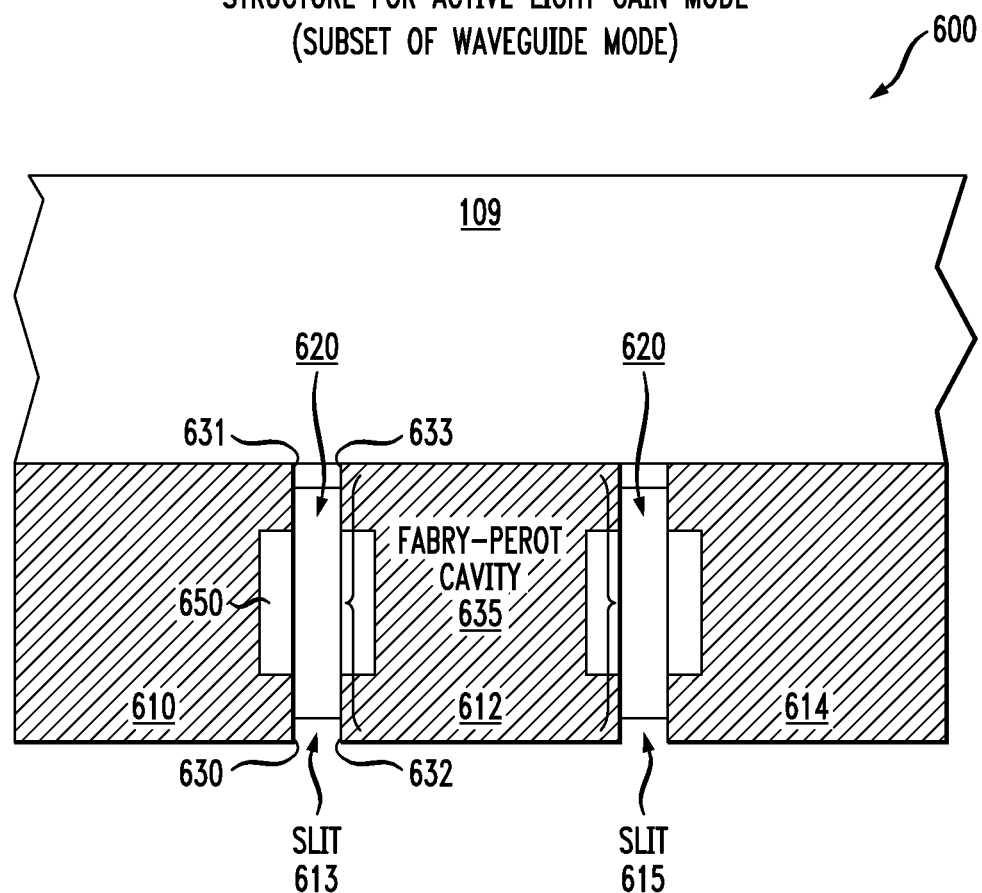

(CROSS-SECTIONAL VIEW THROUGH 101)
TOP VIEW

ACTIVE LIGHT GAIN MODE WITH ELECTRODE PUMPING
(SUBSET OF WAVEGUIDE MODE)

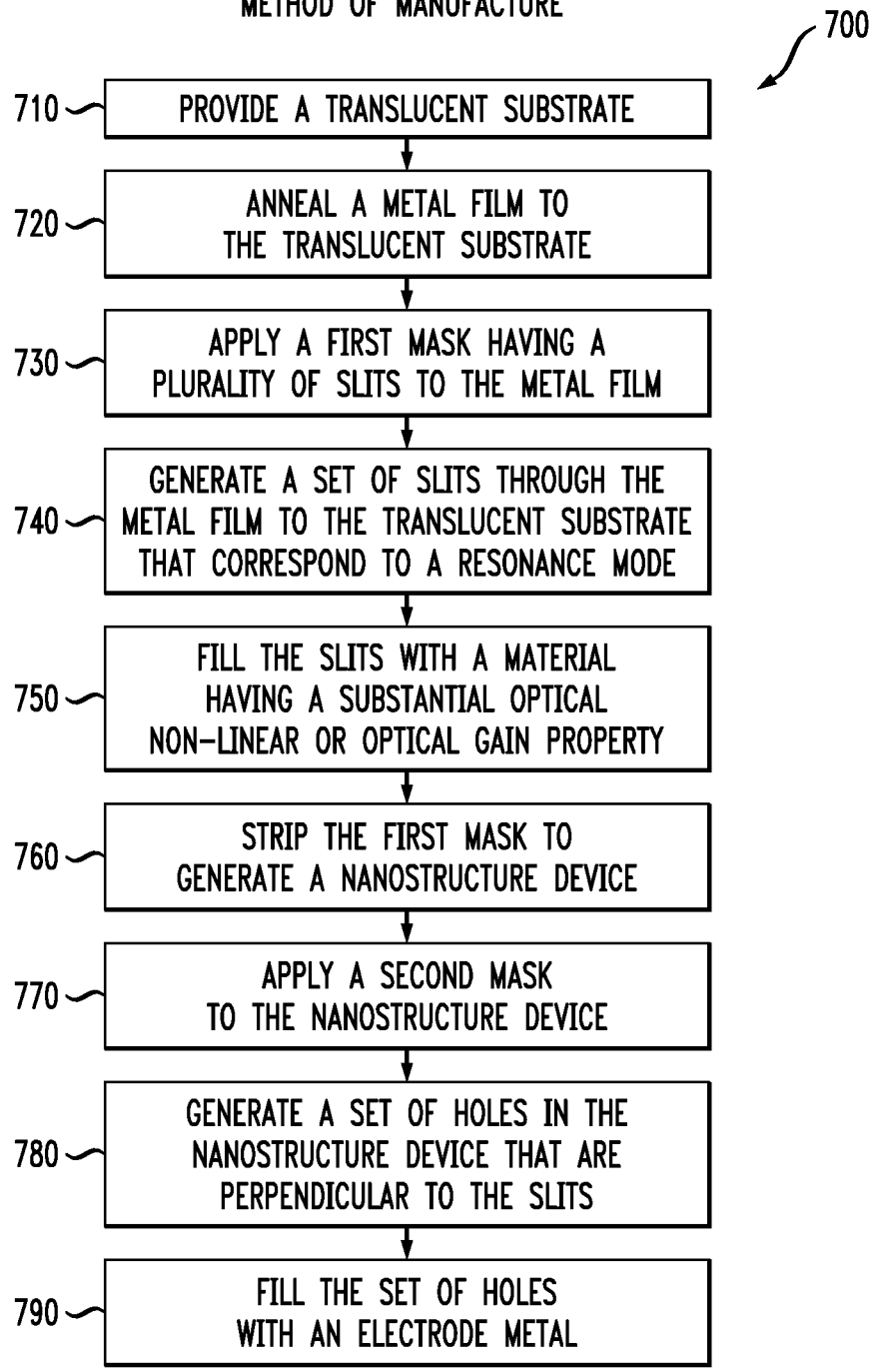

NANOSTRUCTURE LASER

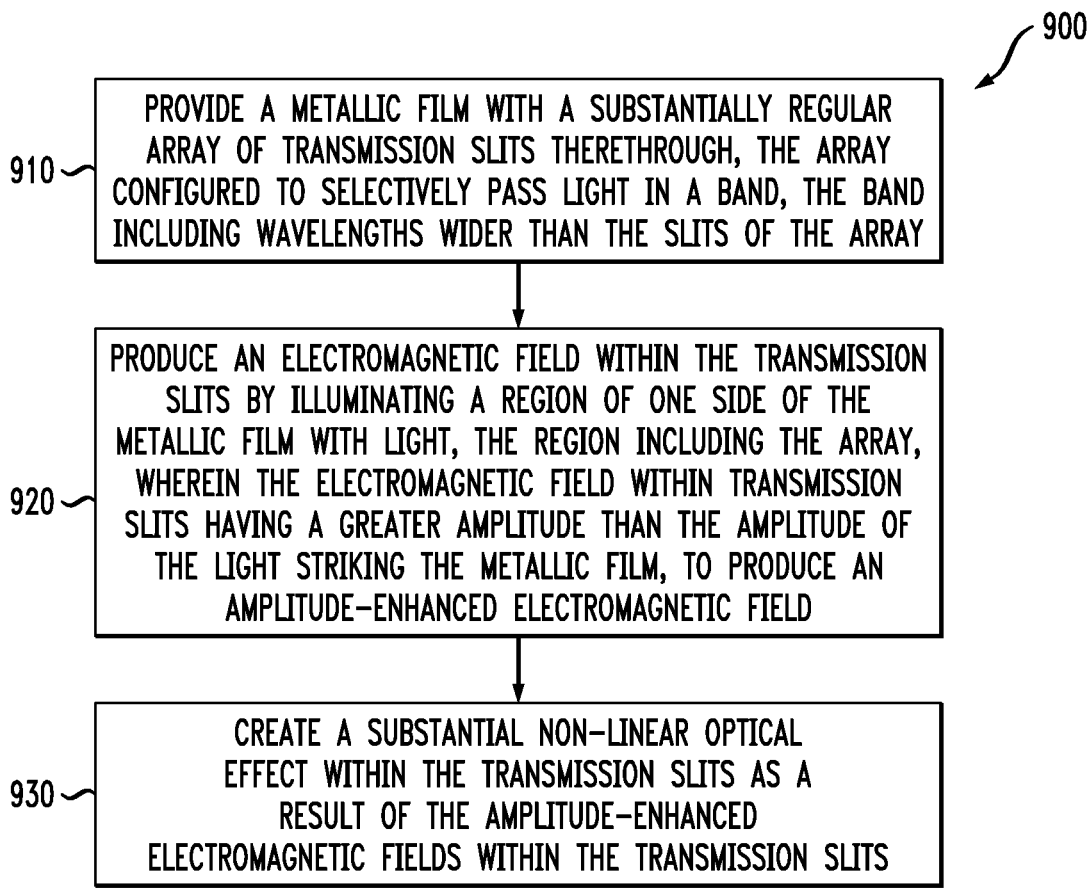

NONLINEAR AND GAIN OPTICAL DEVICES FORMED IN METAL GRATINGS

TECHNICAL FIELD OF THE INVENTION

The invention is directed, in general, to nonlinear optical devices and methods of fabricating and using such devices.

BACKGROUND OF THE INVENTION

Optical grating devices are of increasing importance to today's economy, and every reason exists to believe that the trend will continue. In classical optics, when a slit exists in a thin nonmetallic film, and the diameter of the slit is much less than the wavelength of incident light, the amount of light that traverses the slit can be very small.

SUMMARY OF THE INVENTION

The invention provides a nonlinear optical device in one aspect and an optical gain device in another aspect.

In one embodiment, a nonlinear optical system comprises a metallic film having a first side and a second side. The nonlinear optical system further comprises a regular array of slits in the metallic film. The slits connect the first and second sides of the metallic film. The array is configured to selectively transmit through the metallic film light having frequencies of a selected frequency band. The nonlinear optical system still further comprises a nonlinear optical material situated within the slit.

In another embodiment, an optical gain device comprises a metallic film. The film has a plurality of slits therethrough. The array is configured such that the film selectively and resonantly transmits light over a preselected frequency range. The optical gain device further comprises an optical gain medium, situated within or substantially near at least one slit of the plurality of slits.

In yet another embodiment, a method of manufacture of an optical nanostructure is provided. The method comprises providing a translucent or transparent substrate and forming a metal film with an array of slits on the translucent or transparent substrate. The array of slits have a pitch and width such as that optical transmission through the slits has resonance for a wavelength in the range of visible and near-IR e.g. 500 nanometers to 4 microns. A set of slits are generated through the metal film on the translucent or transparent substrate. The holes are filled with a material that has substantial non-linear optical properties.

In still yet another embodiment, a method of generating light is provided. The method comprises providing a metallic film with a substantially regular array of transmission slits therethrough. The array is configured to selectively pass light in a band. The band includes wavelengths wider than the slits of the array. The method further comprises producing an electromagnetic field within the transmission slits by illuminating a region on one side of the film with light of a first wavelength, the region including a portion of the array. In some embodiments, an enhancement of a transmission of a second wavelength of light through the metallic film occurs in response to the step of illuminating the film with the light of the first wavelength.

The foregoing has outlined certain aspects and embodiments of the invention so that those skilled in the pertinent art may better understand the detailed description of the invention that follows. Additional aspects and embodiments will be described hereinafter that form the subject of the claims of the invention. Those skilled in the pertinent art should appreciate that they can readily use the disclosed aspects and embodiments as a basis for designing or modifying other structures for carrying out the same purposes of the invention. Those skilled in the pertinent art should also realize that such equivalent constructions do not depart from the scope of the invention.

BRIEF DESCRIPTION OF THE DRAWINGS

For a more complete understanding of the present Application, reference is now made to the following descriptions taken in conjunction with the accompanying drawings, in which:

FIG. 2A is a cross-sectional view of an embodiment of a physical structure of FIG. 1A for generating surface plasmons;

FIG. 2B illustrates a cross-sectional view of an application of the physical structure of FIG. 1A in a nonlinear optical device in which the surface plasmons are generated using an optical pump;

FIG. 3 illustrates a cross-sectional view of an alternative application of the physical nanostructure of FIG. 1A as a nonlinear optical device without an optical pump;

FIG. 4B illustrates a cross-sectional view of an application of the waveguide mode of FIG. 4A in a nonlinear optical device;

FIG. 5B illustrates a cross-sectional view of an application of waveguide modes for the alternative physical nanostructure of FIG. 5A as a laser device;

FIG. 6A illustrates a cross-sectional view of a structure of FIG. 1B for a laser device;

FIG. 7 illustrates a method of manufacture of a structure;

FIG. 9 illustrates a method of use of a structure.

DETAILED DESCRIPTION

Figure 1A:
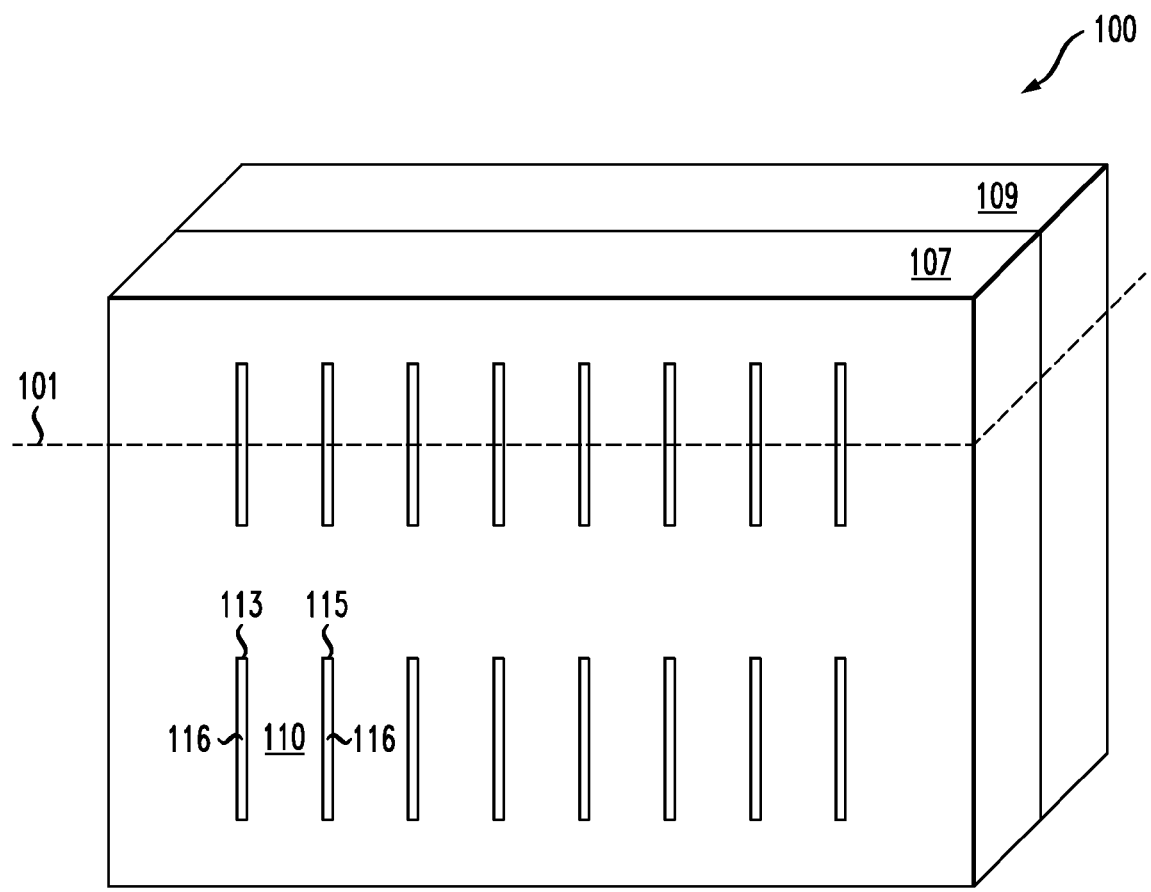
FIG. 1A illustrates a front view of an embodiment of a non-linear optical device, optical amplifier, or nanostructure laser.

Referring initially to FIG. 1, illustrated is an embodiment of a device 100 for use as a nonlinear optical device, an optical amplifier, or a laser. The device 100 has a metal film 107 coupled to a translucent or transparent substrate 109, e.g., a translucent or transparent silicon dioxide substrate. In one embodiment, a thickness of the metal film 107 is about 200 nanometers. In one embodiment, the thickness of the substrate 109 is about 1 millimeter, and the substrate 1009 includes silicon dioxide, although other thicknesses and materials can be used. In FIG. 1A, a vertical dissection line 101 is referenced for later use.

The device 100 has a plurality of transmission slits ("slits") 113, 115 that traverse from a front of the metal film 107 to a back of the metal film 107. In some embodiments, a width of the slits 113, 115 is 50-500 nanometers, and a height of the slits 113, 115 is 5-10 microns, although the height of the slits 113, can be in the macroscopic range, e.g., greater than about 1 millimeter. The slits 113, 115, also have a regular periodicity, also known as a "pitch" 110 and may have about the same width. In one embodiment, the pitch 110 is one slit 113 per micron along the surface of the device 100, although other pitches are used in other embodiments.

Each slit 113, 115, further contains an optical dielectric or semiconducting media 116 which is either a non-linear optical material or an optical gain media. Generally, a nonlinear optical material is for nonlinear optical devices, and gain media is for an amplifier and laser.

The slits 113, 115 are typically narrower than the wavelength of the light that the non-linear optical media is configured to amplify or wavelength-convert. In other words, the slit width is sub-wavelength. The metallic film 107 is typically thicker than the skin depth of the metal for the same wavelength of light so that such light would not substantially penetrate through the metallic film 110 in the absence of the array of slits 113, 115.

If slits in a metallic film, such as the metallic film 107, are arranged to form a grating, the amount of light that is transmitted through such a structure can be several orders of magnitude higher than standard optical diffraction theory predicts. In certain circumstances, the fraction of light that is transmitted through a grating formed in a metallic film approaches 100%, e.g., the transmitted intensity may be greater than about 50% of the incident intensity and may be preferably greater than about 80% of the incident intensity.

It is believed that an enhanced transmission will occur due to waves of charge propagating along the surfaces of the metallic film. Charge wave excitations and associated electromagnetic fields that propagate along a metal surface or a metal-dielectric interface are known as surface plasmonic waves or "surface plasmons."

When slits in a metallic film, such as the metallic film 107, are spaced regularly with a certain pitch to form a grating, light incident on one side of the metallic film can cause a complex, banded plasmon structure to arise and propagate on the surface of the film. The incident light can resonantly couple to such surface plasmons. Indeed, such surface plasmons can couple one side of the metallic film 107 to the other side of the metallic film 107 through the slits grating therethrough, thereby generating surface plasmons on the other side of the metallic film 107. The corresponding surface plasmons on the other side of the metallic film 107 can then, create electromagnetic waves (e.g., light) that radiates from other side of the metallic film 107.

In general, two types of resonant modes allow the surface plasmons on one side of the film to couple, through the grating to surface plasmons on the other side of the metallic film 107. The two modes are "plasmon modes" and "waveguide modes." For the purposes of the present disclosure, a "resonant mode" is deemed to include a plasmon mode, a waveguide mode, or both.

Each mode has at least one associated resonant frequency band. Typically, light in such a frequency band is needed to efficiently excite the corresponding resonant modes. In a surface plasmon mode, the pitch of the slits primarily determines the resonant frequency; in a waveguide mode, the height of the slits primarily determines the resonant frequency.

Although surface plasmon modes and waveguide modes generally have different resonant frequency bands, the bands may overlap in some circumstances and embodiments. Surface plasmon modes and waveguide modes generally exhibit enhanced electromagnetic fields close to the surface and interfaces of the periodic slits (including in the slits themselves). The waveguide modes will also exhibit enhanced electromagnetic fields in or near the grating.

In various embodiments of the device 100, the optical media 116 is capable of amplifying, wavelength converting, or nonlinearly modifying a signal light incident on a first surface of the metallic film 110, in response to an optical pumping. The pumping light is also incident on the metallic film 107 when the device 100 behaves, such as a non-linear optical media or optical gain media. In some embodiments wherein the device 100 is configured as a laser, an optical pump can also be removed, as the light amplification starts with spontaneous emission of an optical media, and therefore an optical pump is not necessary.

Generally, in the device 100, there are various optical resonance modes which are either a surface plasmon mode or a waveguide mode. Typically, in the device 100, such resonant modes are used to enhance the intensity (i.e., the amplitude) of the electromagnetic field of incident light in the slits or 113, 115 that pierce the metallic film 107. In the slits 113, 115, the enhanced intensity of the electromagnetic fields is due to the resonant mode or resonant modes that optically couple the two surfaces of the metallic film 107. The high intensity electromagnetic field in the slits modifies the optical properties of the nonlinear optical or optical gain material in the slits thereby modifying optical characteristics of light passing through the slits 113, 115.

For instance, if the surface area slit of the slit 113 is ten square nanometers, and the entire area struck by the pump light 140 is one hundred square nanometers, the amplitude of an electromagnetic field can be approximately ten-fold (100 nanometers divided by 10 nanometers) in the slits. The electro-magnetic field intensity can be about a hundred times larger in the slits than at the surface of the metal film. Such one-hundred-fold increase in an electromagnetic field intensity can be significantly affect the optical properties of nonlinear when dealing with nonlinear optical materials, such as a nonlinear optical media 120.

In particular, the optical medium 116, situated in or proximate to the slits 113, 115 can be a nonlinear optical material that can wavelength convert, or nonlinearly modify the phase or amplitude of the incident light. These nonlinear effects can be self induced by the incident light itself or can be induced by light of a different wavelength from a separate optical pump. The nonlinear media 116 can be a material such a nonlinear optical inorganic (e.g. semiconducting or insulating materials, such as lithium niobate or a group 3-5 semiconductor) or organic (e.g. polymeric) materials deposited in the slits 113, 115, or a polymer with optically active quantum dots dispersed therein. Herein, "proximate" is defined to mean within one to several wavelengths of the pump light.

The optical medium 116 can also be optical gain medium, which under optical pumping can achieve population inversion. The incident light can then be amplified when passing through the slits. For the optically pumped amplifier, the pitch and the thickness of the metallic film 107 is calculated and fabricated such that the pumping wavelength is resonant with either surface plasmon or waveguide modes and the amplifying wavelength is resonant with excitation of a surface plasmon mode. For an optically pumped laser, the pitch and the thickness of the metal films is designed such that the pumping wavelength is resonant with excitation of either a waveguide or surface plasmon mode and the lasing wavelength is resonant with excitation of a waveguide mode.

Figure 1B:
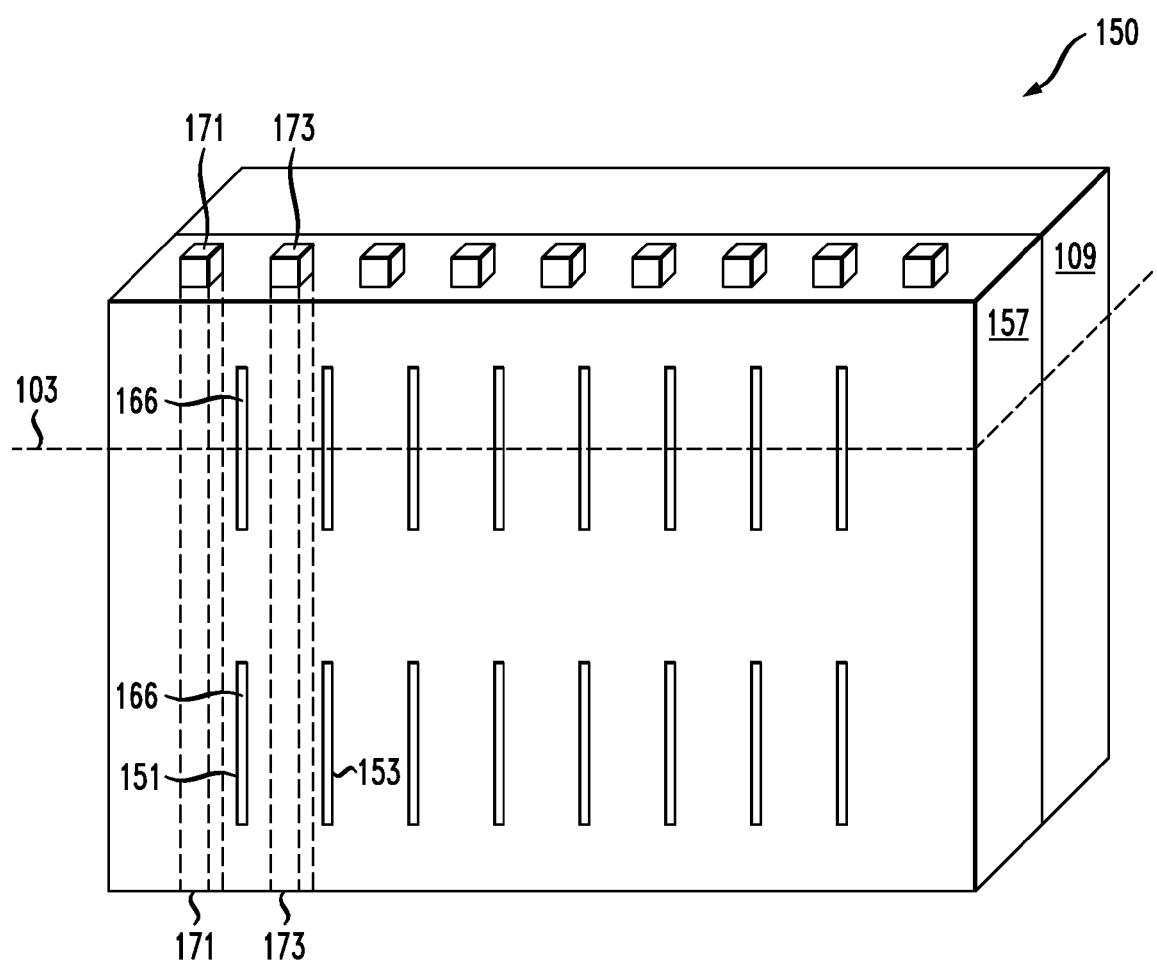
FIG. 1B illustrates a front view of an embodiment of an optical amplifier or laser having electrodes.

Turning now to FIG. 1B, illustrated is a laser or optical amplifier 150 that employs electrodes 171, 173 that are coupled to an optical gain medium 166. In FIG. 1B, a vertical dissection line 103 is referenced for later use. The electrodes 173, 175 can be used to pump the optical gain medium 166 to achieve a population inversion. In embodiments of lasers, the lasing feedback occurs because slits 151, 153 have been configured to work in a "waveguide" mode for the lasing wavelength. The waveguide mode can be understood as a cavity mode in an optical cavity with the two ends of the slides being the boundaries of the cavity. In the laser 150, the pitch and thickness of a metal film 157 is configured to support a waveguide resonance mode for the amplifying wavelength and a waveguide resonance for the lasing wavelength. In further embodiments, the laser is further configured to support a surface plasmon mode.

In the illustrated embodiment 150, the slits 151, 153 have a width of less than the lasing wavelength. They also have a height that can be between a fraction of the wavelength of an incident light to several wavelengths depending on the desired resonance. For example, the height can be from several tens of nanometers to several tens of microns. The pitch between the slits can be several tens of nanometers up to about 10 microns, depending on the resonance wavelength of interest.

Turning now to FIG. 2A, illustrated is a cross section of an embodiment of a device 200 having a grating for generating surface plasmons of FIG. 1A for nonlinear optical devices. The view given is that of a slice through the device 100 through intersection 101.

The device 200 has a metal 210, 212, 214 on the sides of optical media 220. In particular, the nonlinear optical material 220 is situated within or proximate to the slits 213, 215 through a metal film. A back of the metal 210, 212, 214 is coupled to the transparent or translucent silicon dioxide substrate 109. In one embodiment, the substrate 109 is one millimeter thick silicon dioxide, although other thicknesses can be used.

Typically, the electromagnetic field intensity within the slits 213, 215 has an intensity that is proportional to the square of the pitch divided by slit width. In other words, the pitch of the slits 213, 215 divided by a horizontal width of a slit can be designed to enhance the intensity of the electromagnetic field within the slits 213, 215.

FIG. 2B illustrates a use of the grating 200 for generating surface plasmons in a nonlinear optical device. A pump light 240 strikes the metal 210, 212, 214 of the metallic film 107, optically exciting resonant modes, which in turn create an amplitude-enhanced electromagnetic field 219 by the surface Plasmon effect in and in vicinity to the slits 213, 215. These amplitude-enhanced electromagnetic fields 119 enhance or otherwise modify the optical properties of the nonlinear media 220.

A signal light 235 is introduced into the nonlinear optical media 220, and a transmitted signal 270 is generated as a result of a modification of the signal light by the non-linear optical media 220 in the slits. The transmitted signal 270 can be modified as a result of absorption saturation, induced transparency, second harmonic generation of light, a sum-difference generation of light, or four-wave mixing that occurs due to the enhanced electromagnetic field 219 in the slits. Generally, the interaction of the signal light 235 with the nonlinear optical media 220 is controlled by the enhanced electromagnetic field 219 in the slits 213, 215.

The amount of enhancement of the electromagnetic field 219 strength within the slits 213, 215 may depend on the area of the slit 113. For example, the enhancement may depend on the ratio of the area of the slit openings over the area of the metal of the device 200 that is struck by light.

In one embodiment, the signal light 235 resonantly excites a resonant mode that enables the signal light 235 to propagate through the slits 213, 215. In such embodiments, the device 200 is a band-pass filter for the signal light 235, because only certain resonant frequencies can pass through the device 200.

FIG. 3 illustrates an alternative use of nonlinear optical device 300 in surface plasmon mode. A signal light 340 strikes the metal 210, 212, 214 generating resonant modes, i.e., surface plasmon modes, which in turn enhance the magnitude of the amplitude of the electromagnetic fields 219 in and in the vicinity of the slits 213, 215. These enhanced amplitude electromagnetic fields 119 increase the nonlinear optical response of the nonlinear optical media 220.

The signal light itself 340 is then modified in amplitude or phase through its interactions with the non-linear optical media 220, which produce the transmitted light 370. The transmitted light 370 can be produced as a result of an absorption saturation, a self-phase modulation, an induced transparency, a second harmonic generation light, a sum or difference generation of light, or by four-wave mixing generation of light in the non-linear optical media 20 due to the amplitude-enhanced electromagnetic field 319 therein.

Figure 4A:
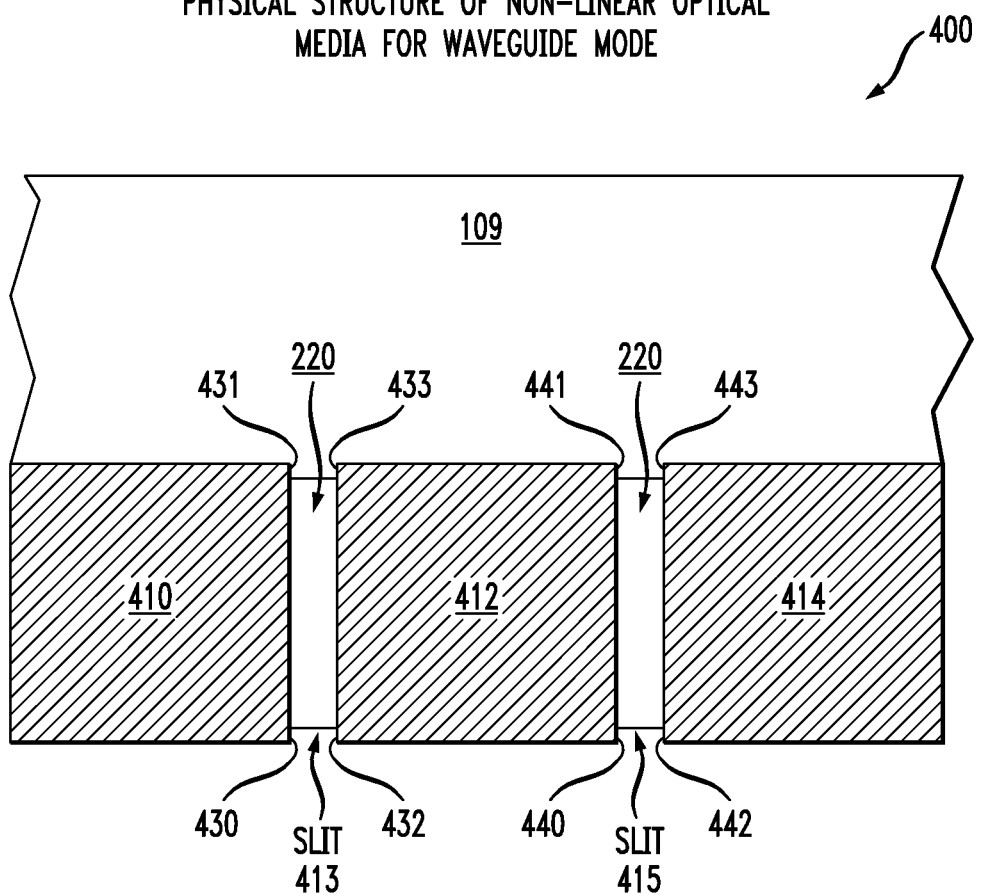
FIG. 4A illustrates a cross-sectional view of a physical structure for generating a waveguide mode in the nonlinear optical device of FIG. 1.

Turning now to FIG. 4A, illustrated is a grating 400 for use with a non-linear optical media when operated in a waveguide mode. A slit 413, 415 has an optical media 220 inside. Each slit has four optically diffractive edges 430, 431, 432, 433 and 440, 441, 442, and 443. The waveguide mode can be understood as a result of an effective optical cavity. The formation of the cavity is understood as a result of the presence of the boundary formed by the diffractive edges 430-433, 440-443. The slits 413, 415 have waveguide mode resonances whose forms are determined by the thickness of the metallic film in which the slits 413, 415 are formed. In the slits 413, 415, an enhanced-amplitude electromagnetic field changes the optical properties of the non-linear optical media 220.

Turning now to FIG. 4B, illustrated is an embodiment of the structure 400, which uses the non-linear optical media 220 in waveguide mode. The diffractive edges enhance the amplitude of an electromagnetic field 419 within the slits 413, 415 thereby changing the optical response of the non-linear optical material 220 to incoming light. Changing the characteristics of the non-linear optical material 220 enables the conversion of the incoming signal light 435 on one side of the slits 413, 415 to transmitted signal light 470 on the other side of the slits 413, 415.

In some embodiments, both resonant mode and waveguide modes are used during operation of the devices. In other words, a separate pump can be used to nonlinearly modify the response of the nonlinear media in the device, wherein the pump light has a wavelength that can resonantly excites both surface plasmon and waveguide mode.

Figure 5A:
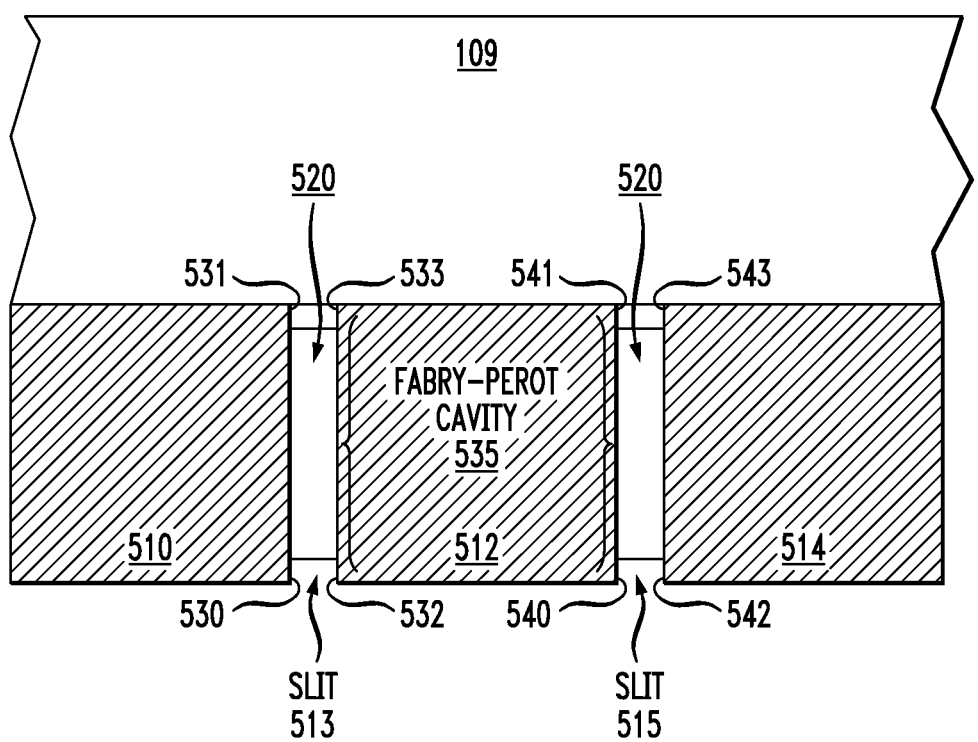
FIG. 5A illustrates a cross-sectional view of an alternative physical structure of FIG. 1A for a laser device.

Turning now to FIG. 5A, illustrates a cross-sectional view along plane 101 in FIG. 1A for an embodiment of the structure of a laser device 500. The structure includes a Fabry-Perot cavity 535 that is effectively based on a waveguide mode at the lasing wavelength. In this embodiment of the device 100, slits 513, 515 have a gain media 220 therein that may be pumped to produce an inverted population of excited states. Each slit 513, 515 has a diffractive edge 530, 531, 532, 533 which acts as an effective mirror for concentrating electromagnetic radiation inside the slits 513, 515. For this reason, each slit 513, 515 is able to function as a Fabry-Perot cavity that can amplify stimulated emission light to produce a laser beam. For such an embodiment, the thickness of the metal film and refractive index of the nonlinear optical media 520 must be configured such that the optical path length of each Fabry-Perot cavity is about ($\frac{1}{2}$+N) times the lasing wavelength or is about N times the lasing wavelength, wherein the choice of N or (½+N) depends on whether reflection at the effective mirrors produces a π phase shift or produces no phase shift. Here, N is a positive integer.

Turning now to FIG. 5B illustrated is a cross section along plane 101 of FIG. 1A for an embodiment of the optical device 500 that operates as a laser. In the illustrated embodiment, a pump light 540 is striking the optical gain media 520. The pump light 540 has a wavelength that resonantly excites either a waveguide or Plasmon mode so the optical field is concentrated in the gain media such that a population inversion can be induced therein. The optical gain media 520 then can generate the spontaneous emission light for lasing at a wavelength that is resonant with a waveguide mode. Alternatively, this embodiment can be used as an optical amplifier, in which incident signal light is amplified by the population inverted gain media without lasing. In this case, light at the amplifying wavelength can resonantly excite a plasmon mode.

The pitch and thickness of the slits 513, 515 is designed such that the pump light resonantly excites either a plasmon or waveguide mode. However, the lasing wavelength is resonant with a waveguide mode.

FIG. 6A shows an illustration of a cross section 600 of the laser 150. The laser 150 includes Fabry-Perot cavities 635 in slits 613, 615, which contain optical gain media 620 therein. Each slit 613, 615 has four diffractive edges 630, 641, 632, 633 which act as effective mirrors for concentrating light inside the slits 613, 615.

Figure 6B:
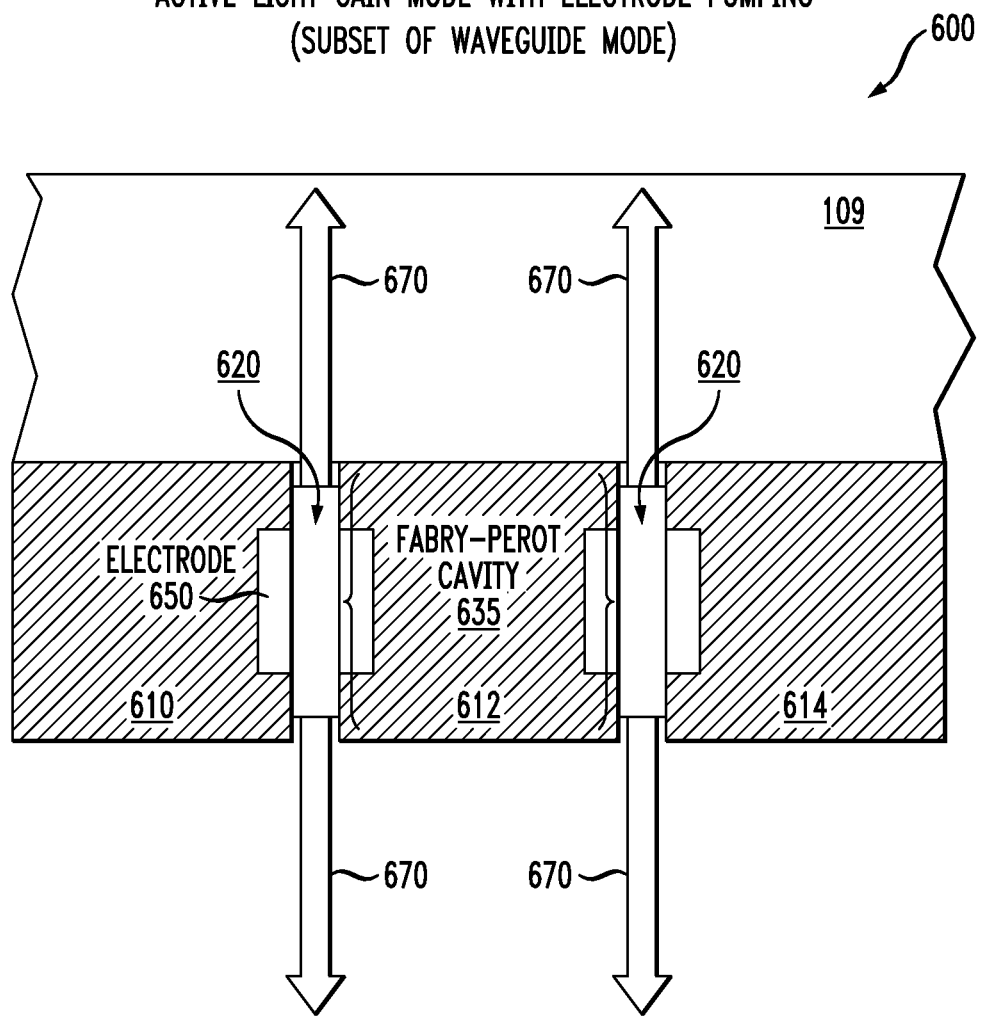
FIG. 6B illustrates a cross-sectional view of an application of the structure of FIG. 1B for a laser device.

FIG. 6B illustrates a cross section of an embodiment of the laser device 600. In the illustrated embodiment, the electrodes 650 carry a current that creates an inverted population of excited electrons or holes within the optical gain media 620 of the Fabry-Perot cavities 635. The gain media 620 can then, output stimulated emission light 570 after amplification in the effective laser cavity formed by effective mirrors 630, 631, 632, and 633. The length of each slit 513, 515 is designed such that the lasing wavelength resonantly excites a waveguide mode therein. The lasing wavelength can be in visible or infra-red ("IR") range. This embodiment can also be used as an amplifier, in which a separate incident signal light is amplified by the inverted population of excited charge carriers (i.e., electrons or holes) located in the gain media 520. In such a case, the amplifying wavelength resonantly excites a plasmon mode on the surface of the metal film.

Turning now to FIG. 7, illustrated is a method of manufacture of the optical device 100 of FIG. 1A, and is some further embodiments, the laser of FIG. 1B.

In a step 710, a translucent or transparent substrate, such as the substrate 109 is provided.

In a step 720, a metal film, such as the metal film 107, is deposited on the translucent or transparent substrate, e.g., via a conventional metal evaporation and deposition process.

In a step 730, a first mask having a plurality of slits is formed on the metal film. In some embodiments, the plurality of slits has a pitch and width suitable to enable incident light to resonatingly excite a surface plasmon mode on the metal film if the film has the slit pattern of the mask. In other embodiments, the dimensions of the slits are calculated so as to enable incident light of a preselected wavelength to excite a waveguide mode within the final slits that will be produced in the metal film. In some further embodiments, the mask is configured to enable the etching of slits designed to accommodate both the optical excitation of waveguide modes therein and the optical excitation of surface plasmon modes on the resulting patterned metal film.

In a step 740, a set of slits are generated, such as through wet or dry etching of the metal film under the control of the mask. In some embodiments, the etching is performed before annealing of the deposited metal film to the transparent or translucent substrate.

In a step 750, the slits are filled with a material having a substantial optical non-linear property. In some alternative embodiments, the material is an optical gain material that can be pumped, e.g., to produce an inverted population of excited ions or charge carriers.

In a step 760, the first mask is stripped off by a conventional process to expose an optical device having a metal layer with a regular array of slits therein, wherein the slits are filled with a nonlinear optical dielectric or semiconductor material, e.g., as in the structure 100 of FIG. 1A.

In some further embodiments, in a step 770, a second mask is applied to the optical device 100. The second mask is applied at the top and bottom of a device, such as the nanostructure device 100 of FIG. 1A.

Then, in some embodiments, in a step 780, a set of holes are generated, i.e., by dry or wet etching under the control of the second mask. The holes are substantially perpendicular to the set of slits in the nanostructure device 150, such as the electrodes 171 and 173 in FIG. 1B. In some embodiments, the electrodes 171 and 173 are formed on the edge of the substrate. In alternative embodiment, the electrodes 171 and 173 are formed with metallization leads that are located on the surface(s) of the substrate outside of areas that will be illuminated with light.

Then, in some embodiments, in a step 790, the set of holes are filled with an electrode metal to generate the device 150. The electrodes are insulated from the metallic film. However, the electrodes form contact with the media in the slit, e.g., to enable the electrical pumping of said medium in embodiments for amplifiers and/or lasers.

Figure 8A:
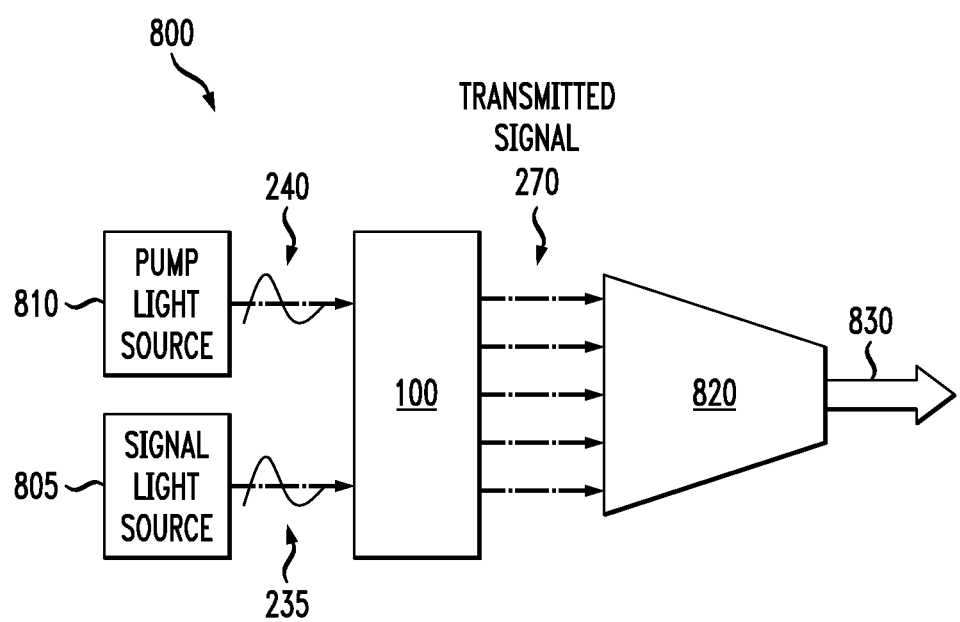
FIG. 8A illustrates a system for generating amplified light with use of the structure of FIG. 1A.

Turning now to FIG. 8A, illustrated is a diagram of an embodiment of system 800 for generating the transmitted signal 270. A signal light source 805 generates the incoming signal light 235, and a pump light source 810 generates the pump light 240. The pump light 240 excites a resonant mode of the device 100 and thereby causes a plurality of transmitted signals 270 to be generated. This resonant mode can be the surface plasmon mode, the waveguide mode, or both. The generated nonlinearly modified signal light 270 is then collected by a tapered waveguide 820. The tapered waveguide 820 then conveys the collected nonlinearly modified signal light 270 to an optical fiber 830, or another optical device 830, such as a bulk optical element. The system 800 can be used for optical switching.

The transmitted signal 270 can arise from a combination of the signal light 235 and an enhancement of the strength of the pump light 240 within the slits 213, 215 of FIG. 2. The enhancement to the strength may be due to a resonant mode that the pump light 840 excites, e.g., a surface plasmon mode on the surface of the device 100 or a waveguide mode within the slit 213, 215. In some embodiments, the pump light 240 and the signal light 235 can have the same frequency and come from a single, incoming signal light beam. In other embodiments, the pump light and incoming signal light have different wavelengths.

Figure 8B:
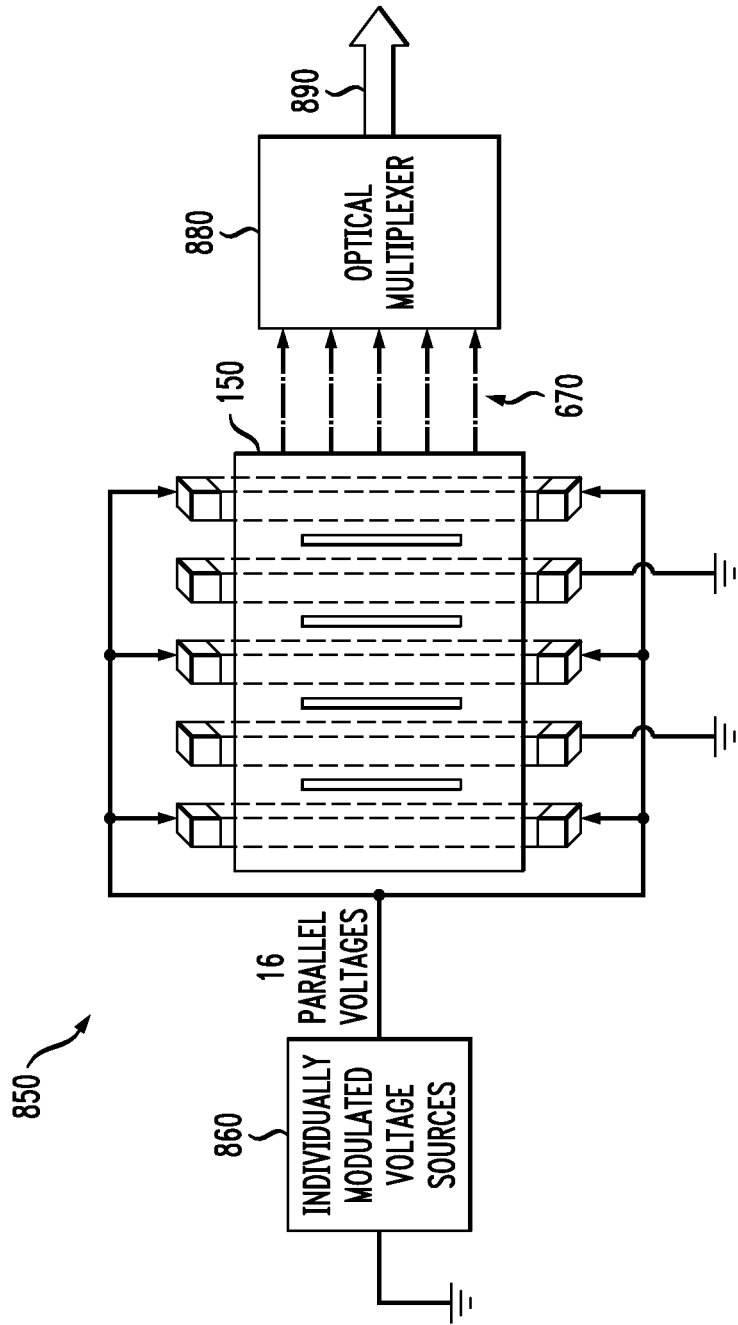
FIG. 8B illustrates a system for generating laser light with electrodes and the structure of FIG. 1B.

FIG. 8B illustrates an embodiment of a system 850 for generating the amplified light 570, e.g., in the device 150 of FIG. 1B. A plurality of individually modulated voltage sources 860 are coupled to electrodes of a laser 870. In the illustrated embodiment, one electrode for each slit in the device 150 is coupled to the voltage source 860 and the second electrode for each slit is coupled to ground.

For this scheme, the current traveling between the electrodes produces an inverted population of charge carriers, i.e., electrons or holes, in the media located in the slits in the device 150. Under such electrical pumping, the media in the slits can amplify incoming light to generate light 670 outgoing from the array of slits in the device 150. The outgoing light 670 is then coupled to an optical multiplexer 880 and is then selected as an output 890. In other embodiments, pump light may be used to pump the media in the slits rather than a current for a laser embodiment of the device 150 of FIG. 8B.

Turning now to FIG. 9, illustrated is a diagram of an embodiment of a flow chart of a method 900 for generating light.

In a step 910, a metallic film is provided with a substantially regular array of slits therethrough, the array is configured to selectively pass light in a wavelength band. The band is limited to wavelengths of light that are longer than the widths of the slits of the array.

In a step 920, a region of one side of the metal film is illuminated with light to produce electromagnetic fields in the slits of the array wherein the electromagnetic field within the transmission slits has a greater amplitude that the electromagnetic amplitude of the light striking the metallic field. That is, the illuminating step 920 produces an amplitude-enhance electromagnetic field inside the slits.

In a step 930, light is output from the slits via a substantial non-linear optical effect in response to the illumination of the slits at the step 920. That is, a nonlinear optical media in the transmission slits generates the light being output as a result of the amplitude-enhanced electromagnetic field in the slits.

In some embodiments, the method further comprises amplifying further comprises receiving pump light in the slits. The slits of the array of slits can include a Fabry-Perot cavity. The pump light can have a wavelength configured to resonantly excite surface plasmon modes on the film or a waveguide mode in the slits. In some embodiments, a transmission of a second wavelength of light is enhanced on the metallic film that occurs in response to the step of illuminating a region of one side.

Those skilled in the art to which the invention relates will appreciate that other and further additions, deletions, substitutions and modifications may be made to the described embodiments without departing from the scope of the invention.

What is claimed is:

1. A system, comprising:
   a metallic film having a first side and a second side;
   a regular array of slits in said metallic film, the slits connecting the first and second sides of the metallic film, the array being configured to selectively transmit through the metallic film light having frequencies in a selected frequency band; and
   a nonlinear optical material situated within said slits.

2. The system as recited in claim 1, further comprising a pump light source configured to project pump light, having a frequency in the selected frequency band, onto at least part of a surface of a metallic film, the part including portions of a plurality of the slits.

3. The system as recited in claim 1, wherein said nonlinear optical material is located on a substantially translucent or transparent substrate.

4. The system as recited in claim 1, wherein said nonlinear optical material comprises lithium niobate.

5. The system as recited in claim 1, wherein said non-linear optical material is capable of frequency converting said light having frequencies in a selected frequency band.

6. The system as recited in claim 1, further comprising an optical multiplexer to select light transmitted from the regular array of slits.

\* \* \* \* \*